United States Patent [19]

Nakano

[11] Patent Number: 5,294,038
[45] Date of Patent: Mar. 15, 1994

[54] METHOD OF AND APPARATUS FOR MANUFACTURING SEMICONDUCTOR DEVICE

[75] Inventor: Tosei Nakano, Tokyo, Japan
[73] Assignee: NEC Corporation, Tokyo, Japan
[21] Appl. No.: 972,991
[22] Filed: Nov. 10, 1992
[30] Foreign Application Priority Data
  Nov. 12, 1991 [JP] Japan .................. 3-295352
[51] Int. Cl.[5] ............................. B23K 31/02
[52] U.S. Cl. .................. 228/179.1; 228/4.5; 228/8
[58] Field of Search .......... 228/179, 4.5, 102, 103, 228/8, 1.1; 219/56.1, 56.21, 56.22

[56] References Cited

U.S. PATENT DOCUMENTS

| | | | |
|---|---|---|---|
| 4,422,568 | 12/1983 | Elles et al. | 228/179 |
| 4,434,347 | 2/1984 | Kurtz et al. | 219/56.21 |
| 4,549,059 | 10/1985 | Kamijo et al. | 219/56.21 |
| 4,594,493 | 6/1986 | Harrah et al. | 219/56.21 |
| 4,877,173 | 10/1989 | Fujimoto et al. | 228/1.1 |
| 5,193,738 | 3/1993 | Hayes | 228/180.2 |

FOREIGN PATENT DOCUMENTS
49-52973  5/1974 Japan .

Primary Examiner—Paula A. Bradley
Assistant Examiner—Chuck Y. Mah
Attorney, Agent, or Firm—Laff, Whitesel, Conte & Saret

[57] ABSTRACT

This invention relates to an apparatus for manufacturing a semiconductor device, which has an auxiliary bonding stage in the vicinity of a wafer stage so that when a wire is disconnected during a bonding operation of a ball bump by wire bonding, the wire can be easily restored to the normal state without using an IC chip on a wafer, and a method of manufacturing a semiconductor device, which comprises the steps of moving a capillary above the auxiliary bonding stage after wire disconnection occurs, pulling out the wire from the capillary above the auxiliary bonding stage, forming a ball at a distal cut end of the wire which is pulled out, and performing ball bump bonding on an electrode of an IC chip placed on the wafer stage with the wire formed with the ball at its distal cut end.

4 Claims, 3 Drawing Sheets

METHOD OF AND APPARATUS FOR MANUFACTURING SEMICONDUCTOR DEVICE

BACKGROUND OF THE INVENTION

1. Field of the Invention

The present invention relates to a method of and apparatus for manufacturing a semiconductor device and, more particularly, to a method of and apparatus for manufacturing a ball bump formed on an electrode pad of a semiconductor chip.

2. Description of the Prior Art

Conventionally, in a semiconductor device such as a film carrier semiconductor device and a flip-chip, bumps as metal projections are formed on the electrode pads of a semiconductor chip (to be referred to as an IC chip hereinafter). Generally, a metal bump made of Au or a solder is selectively formed on an electrode pad by electroplating through a barrier metal layer constituted by a diffusion preventive layer or a adhesive layer. Several methods have conventionally been proposed to replace electroplating bump formation.

An example of such a substitutional proposal is a ball bump method disclosed in Japanese Patent Application Laid-Open Document No. Sho 49-52973. According to this method, a ball is made from a wire made of Au, a solder, or the like by wire bonding, the ball is bonded on an electrode pad, and the wire is cut to leave only the ball, thus forming a bump. This ball bump method is generally practiced by using an automated ball bump bonding apparatus.

A conventional ball bump bonding apparatus has a semiconductor wafer loader 10, a wafer setter (to be referred to as a wafer stage 11 hereinafter), a wafer storage 12, a ball bump bonding head 13, a recognition camera 14, a recognition unit 15, a wire feeder 16, manipulators 24 for moving the bonding head 13 in the X and Y directions, and an operation panel 25, as shown in the outer appearance of FIG. 1. The function of the conventional ball bump bonding apparatus will be described.

As shown in FIG. 1, a wafer on which IC chips are formed is conveyed from the wafer loader 10 to the wafer stage 11, positioned on a bonding stage by urging its orientation flat against pawls or the like, and fixed on the wafer stage 11 by vacuum chucking. Then, the wafer is imaged by the recognition camera 14, the positions of the IC chips on the wafer are detected by the recognition unit 15, the electrodes pads on the IC chips are ball-bonded on the basis of the prestored coordinates data in accordance with the ball bump bonding technique described above, and the wires are cut to attach ball bumps to non-defective IC chips. When ball bumps are formed on all the non-defective IC chips on the wafer, the wafer is conveyed to the wafer storage 12.

Conventionally, if the ball bump bonding apparatus is stopped due to an error, e.g., wire disconnection while automatic ball bump bonding is performed using this apparatus, the wire-disconnected state shown in FIG. 2A wherein the distal end of a wire 17 is retracted in a capillary 18 must be restored to a state shown in FIG. 2B wherein a ball 22 is formed at the distal end of the wire 17, thereby restoring the automated operation. For this purpose, the following procedures are taken. The wire 17 is passed through the capillary 18, as shown in FIG. 3A, the manipulators are manually operated, a defective IC chip which is detected in advance is searched for on a monitor screen, and the bonding head 13 and a bonding arm 20 are moved above the defective IC chip. Then, the wire 17 is urged against the electrode pad on the defective IC chip on a wafer 23 by the capillary 18, as shown in FIG. 3B, a wire clamp is closed while moving the capillary 18 upward, and the wire 17 is cut at its portion urged between the wafer 23 and the capillary 18. A torch rod 21 performs electric discharge toward the wire 17, as shown in FIG. 3C, to form a ball 22 at the distal end of the wire 17, as shown in FIG. 3D.

With this conventional ball bump bonding apparatus, when the apparatus is stopped due to an error, e.g., wire disconnection, a defective IC chip on the wafer must be found in order to set the wire in the ball-up state, that is, in order to form a ball at the distal end of the wire. It is time-consuming to find the defective IC chip. If no defective IC chip is found on the wafer, non-defective IC chips are wasted.

SUMMARY OF THE INVENTION

The present invention has been made in view of the aforementioned circumstances, and has for its object to provide a method of manufacturing a semiconductor device wherein when a ball bump is to be formed on an electrode of a semiconductor chip by ball bump bonding, a ball can be formed at the distal end of a wire without using a non-defective chip even if wire disconnection or the like occurs.

Another object of the present invention is to provide an apparatus for attaining the above-mentioned method.

In order to achieve the above first object, according to the present invention, there is provided a method of manufacturing a semiconductor device in which a ball bump is formed on an electrode of a semiconductor chip by using a ball bump bonding technique, comprising the steps of: when a ball is to be formed on a distal end of a wire in order to form a ball bump, moving a bonding arm above an auxiliary bonding stage; urging the wire against an upper surface of the auxiliary bonding stage by a capillary in order to connect the wire to the upper surface of the auxiliary bonding stage; sequentially, removing the capillary and thereafter cutting the wire from an urged portion thereof; forming a ball on a distal cut end of the wire by electric discharge; and performing ball bump bonding on an electrode of a semiconductor chip formed on a wafer placed on a wafer stage.

In order to achieve the above second object, according to the present invention, there is provided an apparatus for manufacturing a semiconductor device in which a ball bump is formed on an electrode on a semiconductor chip by using a ball bump bonding technique, comprising an auxiliary bonding stage in the vicinity of a wafer stage for placing a wafer thereon, so that when a wire is disconnected during a bonding operation of a ball bump by wire bonding and the disconnected wire is retracted in a capillary, the wire can be easily pulled out again from the capillary and a ball can be easily formed at a distal end of the wire.

According to a preferred embodiment of the present invention, the auxiliary bonding stage in the apparatus for manufacturing a semiconductor device has a metal layer that can be connected to, e g., Al or Au bonding wire on its upper surface.

According to the present invention, since the auxiliary bonding stage is provided to restore the wire to the ball-up state even if an error, e.g., wire disconnection occurs during ball bump bonding, a defective IC chip need not be searched for on the wafer. Even if there is no defective IC chip, a non-defective IC chip will not be damaged by using its electrode pad, resulting in an increase in the operating efficiency of the apparatus and the product yields, which are the advantages of the present invention.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

BRIEF DESCRIPTION OF THE DRAWINGS

FIGS. 2A and 2B are views for explaining a wire loading state in a capillary of the conventional semiconductor device manufacturing apparatus, in which FIG. 2A is a partial side view showing a state wherein the wire is disconnected from a bonding portion and retracted in the capillary, and FIG. 2B is a partial side view showing a ball-up state of the distal end of the wire;

DETAILED DESCRIPTION OF THE PREFERRED EMBODIMENT

The present invention will be described in detail with reference to the accompanying drawings (mainly FIGS. 4A and 4B).

Figure 1:
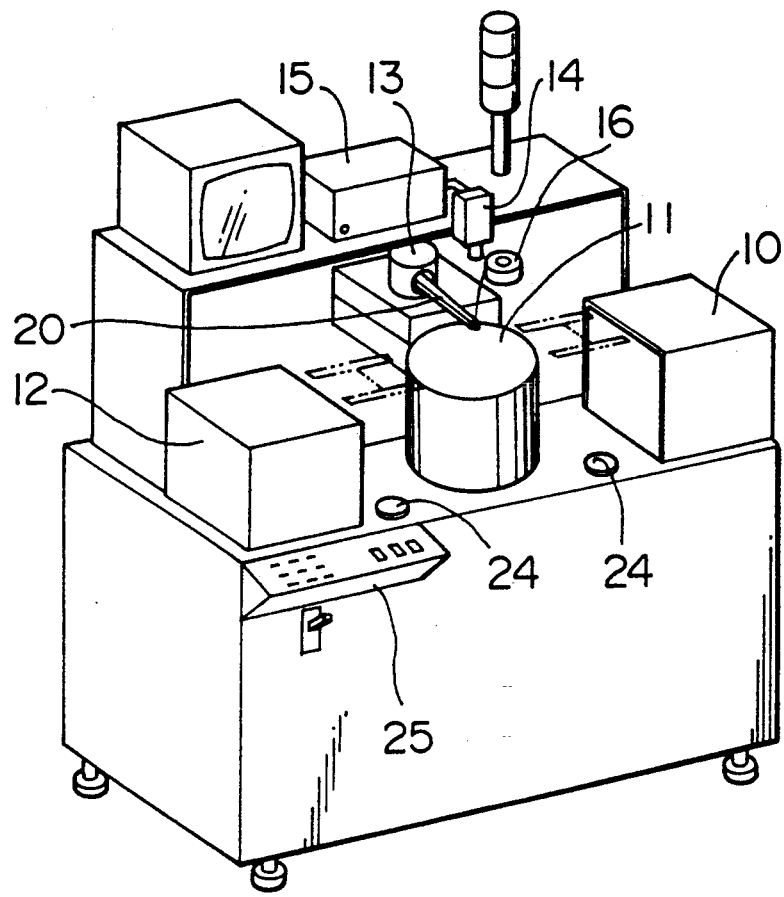
FIG. 1 is a schematic perspective view showing a conventional apparatus for manufacturing a semiconductor device.
Figure 2A:
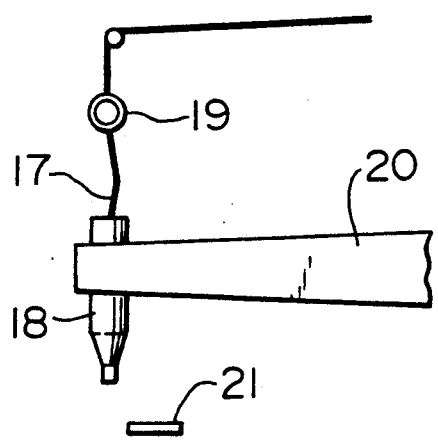
Figure 2B:
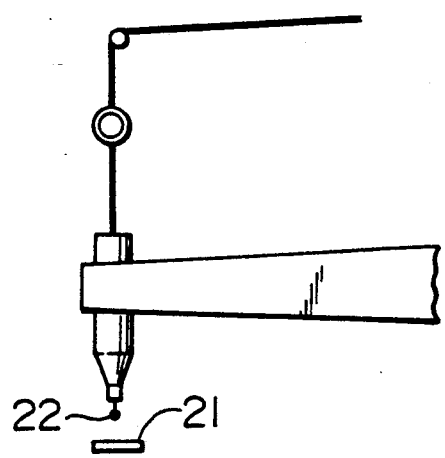
Figure 3A:
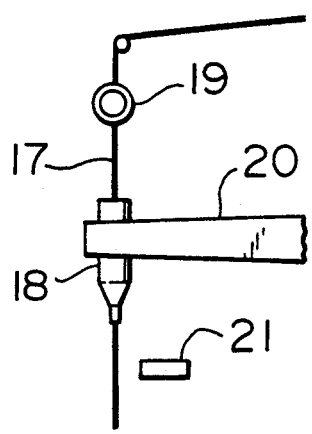
FIGS. 3A to 3D are partial side views, respectively, showing the conventional procedures for setting the distal end of the wire to the ball-up state when wire disconnection occurs.
Figure 3B:
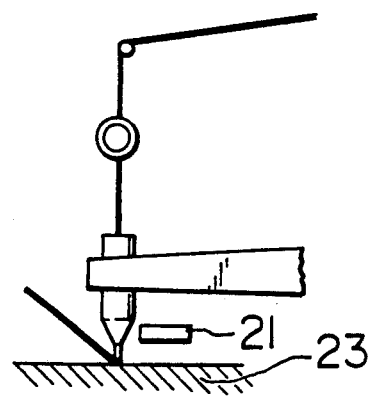
Figure 3C:
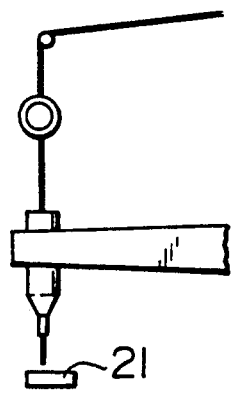
Figure 3D:
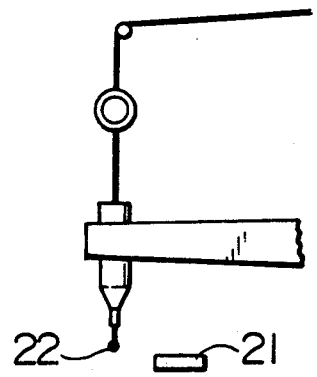
Figure 4A:
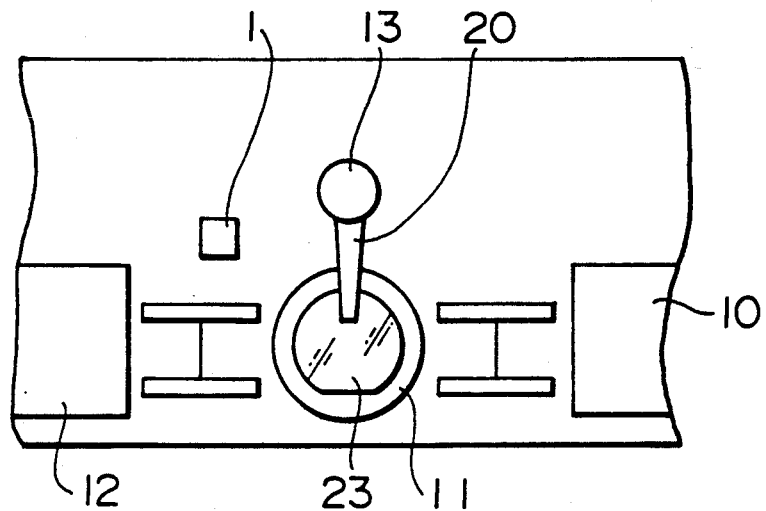
FIGS. 4A and 4B are plan views, respectively, showing a preferred embodiment of the present invention.
Figure 4B:
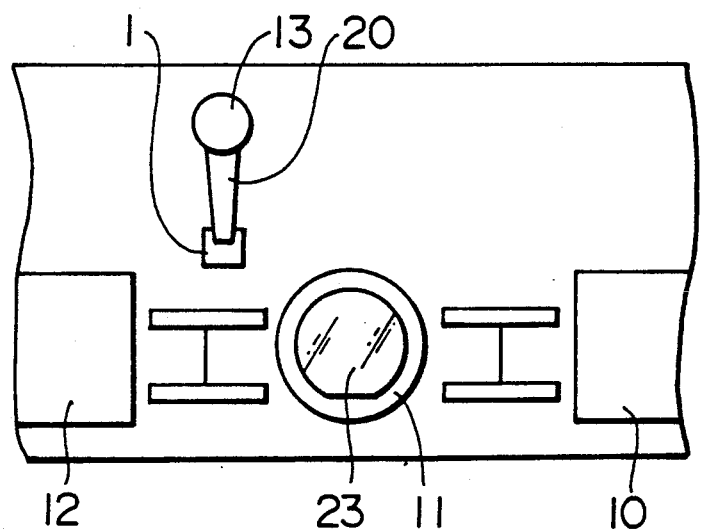

FIGS. 4A and 4B are plan views, respectively, of a ball bump bonding apparatus of a semiconductor manufacturing apparatus according to a preferred embodiment of the present invention. A wafer 23 is conveyed from a wafer loader 10 to a wafer stage 11 and automatic bonding is performed on the wafer stage 11 in accordance with wire bonding, as shown in FIG. 4A. When the apparatus is stopped by an error, e.g., wire disconnection, a bonding head 13 is moved above an auxiliary bonding stage 1 provided in the vicinity of the wafer stage 11 and constituted by an Al plate or the like by a switch operation on the operation panel, as shown in FIG. 4B. The wire is set in the ball-up state on the auxiliary bonding stage 1 in accordance with the procedures shown in FIGS. 3A to 3D. Thereafter, the apparatus is restored in the original bonding state, and automatic bonding is continued.

The above series of operations can be automatically performed by combining it with an automatic wire feed function, a function of detecting a wire and ball formation on the distal end of the wire, and the like. When restoration from an error, e.g., wire disconnection, to the ball-up state is to be automatically performed, it can be effectively performed by providing an auxiliary bonding stage at a specific fixed position, as in this embodiment.

Note that the material to form the auxiliary bonding stage is not specifically limited as far as it allows wire bonding. An Au-plated metal plate or the like can be utilized as the auxiliary bonding stage in addition to the Al plate or the like described above.

What is claimed is:

1. A method of manufacturing a semiconductor device for forming a ball bump on an electrode on a semiconductor chip by using a ball bump bonding technique, comprising the steps of:

when a ball is to be formed on a distal end of a wire in order to form a ball bump, moving a bonding arm away from a wafer stage and above an auxiliary bonding stage near the wafer stage;

urging the wire against an upper surface of said auxiliary bonding stage by lowering a capillary in order to contact the wire onto said upper surface of said auxiliary bonding stage;

sequentially, removing said capillary from said auxiliary bonding stage and thereafter cutting the wire based on a position of said wire when urged against said auxiliary bonding stage;

forming a ball on a distal cut end of the wire by electric discharge; and returning said bonding arm to a position relative to said wafer stage and performing a ball bump bonding on an electrode of a semiconductor chip formed on a wafer placed on a wafer stage.

2. An apparatus for forming a semiconductor device in which a ball bump is formed on an electrode on a semiconductor chip by using a ball bump bonding technique, said apparatus comprising a wafer stage on which an electrode is bonded, an auxiliary bonding stage in the vicinity of said wafer stage for receiving a wafer thereon, so that when a wire is disconnected during a bonding operation of a ball bump by wire bonding and the disconnected wire is retracted in a capillary, the wire can be easily pulled out again from said capillary and a ball can be easily formed at a distal end of the wire.

3. An apparatus according to claim 2, wherein said auxiliary bonding stage has a metal layer on an upper surface thereof to be able to be connected to a bonding wire.

4. An apparatus according to claim 3, wherein said metal layer is made of Al or Au.

* * * * *